United States Patent
Al-Hashimi et al.

(10) Patent No.: US 10,927,214 B2
(45) Date of Patent: Feb. 23, 2021

(54) METHOD OF MAKING A PYRROLO BISTHIAZOLE HOMOPOLYMER

(71) Applicant: QATAR FOUNDATION FOR EDUCATION, SCIENCE AND COMMUNITY DEVELOPMENT, Doha (QA)

(72) Inventors: Mohammed Al-Hashimi, Doha (QA); Hugo Bronstein, London (GB)

(73) Assignee: QATAR FOUNDATION FOR EDUCATION, SCIENCE AND COMMUNITY DEVELOPMENT, Doha (QA)

( * ) Notice: Subject to any disclaimer, the term of this patent is extended or adjusted under 35 U.S.C. 154(b) by 0 days.

(21) Appl. No.: 15/928,944

(22) Filed: Mar. 22, 2018

(65) Prior Publication Data
US 2018/0282473 A1 Oct. 4, 2018
US 2019/0218337 A9 Jul. 18, 2019

Related U.S. Application Data

(60) Provisional application No. 62/481,657, filed on Apr. 4, 2017.

(51) Int. Cl.
*C08G 61/12* (2006.01)
*H01L 51/00* (2006.01)
(Continued)

(52) U.S. Cl.
CPC ......... *C08G 61/126* (2013.01); *C08G 61/123* (2013.01); *C08G 61/124* (2013.01);
(Continued)

(58) Field of Classification Search
CPC ............. H01L 51/0036; H01L 51/0043; H01L 51/0558; C08G 61/126; C08G 2261/92;
(Continued)

(56) References Cited

U.S. PATENT DOCUMENTS

2013/0144065 A1 6/2013 Mishra

FOREIGN PATENT DOCUMENTS

WO 200608454 A1 8/2006
WO 2012/016925 A2 2/2012

OTHER PUBLICATIONS

Casey Brian McCausland: "Application of Dithieno [3,2-b:2',3'-d] Pyrroles and its Analogoues to Conjugated Materials," Graduate Thesis, Jun. 20, 2014, Fargo North Dakota.
(Continued)

*Primary Examiner* — Shane Fang
(74) *Attorney, Agent, or Firm* — Nath, Goldberg & Meyer; Richard C. Litman

(57) ABSTRACT

The method of making a pyrrolo bisthiazole homopolymer starts with dissolving a dibrominated pyrrolo[3,2-d:4,5-d'] bisthiazole monomer having the formula:

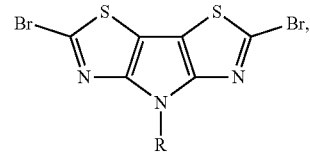

where R is an alkyl group, in anhydrous tetrahydrofuran (THF). Then, the solvated monomer is treated with 1 equivalent of a Turbo-Grignard reagent complex having the formula ${}^i$PrMgCl.LiCl at 0° C. to form a reaction mixture. The reaction mixture is stirred for 1 hour at room temperature, and after stirring, the reaction mixture is refluxed for 24 hours. A conjugated homopolymer product having the formula:

(Continued)

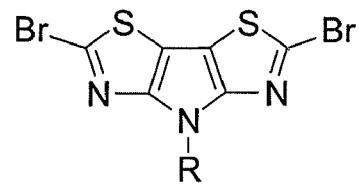

$^i$PrMgCl.LiCl
Anh. THF, 0 °C-reflex, 24h

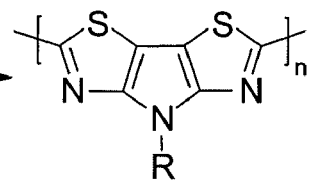

1a: R = 2-octyldodecyl
1b: R = n-hexadecyl
1c: R = 9-heptadecyl
1d: R = 2-ethylhexyl P1: R = 2-octyldodecyl
P2: R = n-hexadecyl
P3: R = 9-heptadecyl
P4: R = 2-ethylhexyl

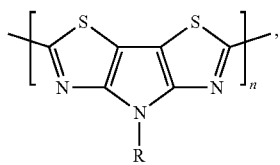

where n is the number of repeating units of pyrrolo[3,2-d: 4,5-d']bisthiazole, is recovered from the reaction mixture. The PBTz-based homopolymers showed broad absorption from 450 to 850 nm in thin film and excellent photochemical and thermal stability, making the polymers suitable for lightweight, low cost plastic electronic devices.

3 Claims, 3 Drawing Sheets

(51) Int. Cl.
  *H01L 51/05* (2006.01)
  *H01L 51/42* (2006.01)
(52) U.S. Cl.
  CPC ...... *H01L 51/0035* (2013.01); *H01L 51/0036* (2013.01); *C08G 2261/11* (2013.01); *C08G 2261/1412* (2013.01); *C08G 2261/18* (2013.01); *C08G 2261/417* (2013.01); *C08G 2261/91* (2013.01); *C08G 2261/92* (2013.01); *H01L 51/0558* (2013.01); *H01L 51/4253* (2013.01)
(58) Field of Classification Search
  CPC .... C08G 2261/1412; C08G 2261/3223; C08G 2261/3327; C08G 2261/344; C08G 2261/364; C08G 2261/124; Y02E 10/549
  See application file for complete search history.

(56) References Cited

OTHER PUBLICATIONS

Mohammed Al-Hashimi et al., "Synthesis and Characterization of Fused Pyrrolo[3,2-d:4,5']bisthiazole-Containing Polymers", Organic Letters (2010), pp. 5478-5481,12(23) (Abstract only).
Ruidong Xia et al., "Fused pyrrolo[3,2-d:4,5-d']bisthiazole-containing polymers for using in high-performance organic bulk heterojunction solar cells", Solar Energy Materials and Solar Cells (2012), pp. 112-116, vol. 96 (Abstract only).
Dhananiaya Patra et al., "Synthesis of low band gap polymers based on pyrrolo[3,2-d:4,5-d]bisthiazole (PBTz) and thienylenevinylene (TV) for organic thin-film transistors (OTFTs)", Journal of Materials Chemistry C (2017), pp. 2247-2258, vol. 5 (Abstract only).
H-L Su et al., "Bithiazole: An IntriguingElectron-Deficient Building for Plastic Electronic Applications", Macromolecular Rapid Communications, pp. 1-47.

1a: R = 2-octyldodecyl
1b: R = n-hexadecyl
1c: R = 9-heptadecyl
1d: R = 2-ethylhexyl P1: R = 2-octyldodecyl
P2: R = n-hexadecyl
P3: R = 9-heptadecyl
P4: R = 2-ethylhexyl

METHOD OF MAKING A PYRROLO BISTHIAZOLE HOMOPOLYMER

CROSS-REFERENCE TO RELATED APPLICATION

This application claims the benefit of U.S. Provisional Patent Application Ser. No. 62/481,657, filed Apr. 4, 2017.

BACKGROUND

1. Field

The disclosure of the present patent application relates to polymers, and particularly to a method of making a pyrrolo bisthiazole homopolymer.

2. Description of the Related Art

Conjugated solution-processable polymeric semiconductors have been widely explored as materials for lightweight, low cost, flexible plastic electronics and potential application in large area devices. Recently significant development has been made in the design and synthesis of high performance polymers, with mobilites now surpassing $\mu > 1$ cm$^2$ V$^{-1}$ cm$^{-1}$ and power conversion efficiency (PCE) over 10%. Currently, the most investigated, by far, are those based on the thiophene core. Among recent examples dithienopyrrole (DTP) polymers have demonstrated good carrier mobility and PCEs. An analogue of DTP is pyrrolo[3,2-d:4,5-d0] bisthiazole (PBTz), wherein displacing the flanking electron-rich thiophene rings with the more electron-deficient thiazole units lowers the highest occupied molecular orbital (HOMO) and results in the increase in the electron affinity and ionization potential of the polymers. The present inventors and several other groups have reported the copolymerization of PBTz with a variety of substituted and unsubstituted co-monomer units. However, to the best of our knowledge there have been no reports on the homopolymerization of PBTz, the reason being based on the difficulty in obtaining highly soluble polymers using the available chain growth polycondensation methods.

Furthermore, most of the reported examples for chain growth polymerization usually use transition metal-mediated cross coupling reactions to synthesize conjugated polymers. Transition metal catalyst systems are often expensive, toxic (Sn-derivatives), and they generally require air-sensitive and expensive phosphine ligands. Form an environmental and economical prospective, an important approach is the development of transition metal-free catalyzed reactions for the synthesis of i-conjugated polymers.

Thus, a method of making a pyrrolo bisthiazole homopolymer solving the aforementioned problems is desired.

SUMMARY

The method of making a pyrrolo bisthiazole homopolymer starts with dissolving a dibrominated pyrrolo[3,2-d:4, 5-d']bisthiazole monomer having the formula:

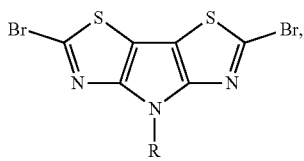

where R is an alkyl group, in anhydrous tetrahydrofuran (THF). Then, the solvated monomer is treated with 1 equivalent of a Turbo-Grignard reagent complex having the formula $^{i}$PrMgCl.LiCl at 0° C. to form a reaction mixture. The reaction mixture is stirred for 1 hour at room temperature, and after stirring, the reaction mixture is refluxed for 24 hours. A conjugated homopolymer product having the formula:

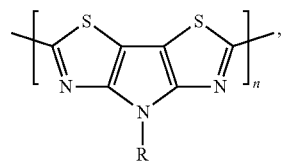

where n is the number of repeating units of pyrrolo[3,2-d: 4,5-d']bisthiazole, is recovered from the reaction mixture. The PBTz-based homopolymers showed broad absorption from 450 to 850 nm in thin film and excellent photochemical and thermal stability, making the polymers suitable for lightweight, low cost plastic electronic devices.

These and other features of the present disclosure will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The method of making a pyrrolo bisthiazole homopolymer starts with dissolving a dibrominated pyrrolo[3,2-d:4, 5-d']bisthiazole monomer having the formula:

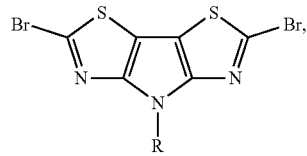

where R is an alkyl group, in anhydrous tetrahydrofuran (THF). Then, the solvated monomer is treated with 1 equivalent of a Turbo-Grignard reagent complex having the formula $^{i}$PrMgCl.LiCl at 0° C. to form a reaction mixture. The reaction mixture is stirred for 1 hour at room temperature, and after stirring, the reaction mixture is refluxed for 24 hours. A conjugated homopolymer product having the formula:

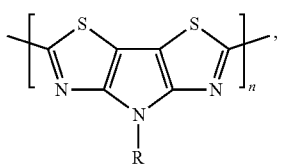

where n is the number of repeating units of pyrrolo[3,2-d:4,5-d']bisthiazole, is recovered from the reaction mixture. The PBTz-based homopolymers showed broad absorption from 450 to 850 nm in thin film and excellent photochemical and thermal stability, making the polymers suitable for lightweight, low cost plastic electronic devices.

Figure 1:
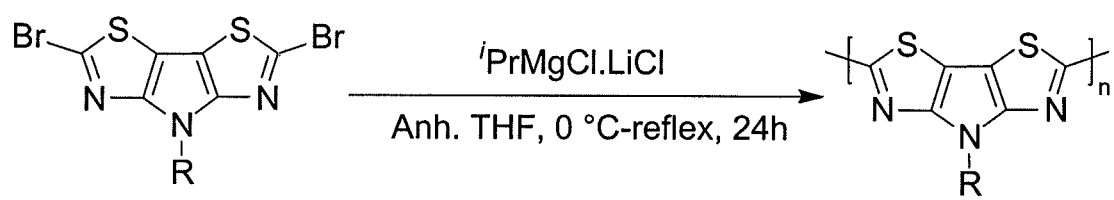
FIG. 1 is a reaction scheme showing a method of making a pyrrolo bisthiazole homopolymer as described herein.

Referring to FIG. 1, dibromo pyrrolo[3,2-d:4,5-d']bisthiazoles (PBTz) 1a-d were synthesized according to our previously reported procedures. Our studies commenced when we noted a significant color change in the attempted homopolymerization of 1a with one equivalent of turbo Grignard reagent ($^i$PrMgCl·LiCl), i.e., a deep blue color formed immediately. Alternative experiments were carried out using different stoichiometric amounts of the turbo-Grignard, including 1.5, 2, and 2.5 equivalents of the turbo-Grignard reagent, respectively. It is important to mention that when increasing the equivalence of the turbo Grignard reagent (1.5-2.5 equiv.) for the magnesium halogen exchange of 2,5-dibromo PBTz, this resulted in the formation of the di-substituted Grignard reagent, leading to the formation of oligomeric materials. Therefore, the reaction scheme of FIG. 1 worked only when the turbo-Grignard reagent was present as 1.0 equivalent of the PBTz.

It will also be noted that the magnesium halogen exchange with bromine was performed at low temperature (0° C.) to prevent side product formation, and thus, resulted in good monomer conversion.

Motivated by the positive results with 1a, we expanded the substrate scope by modifying the alkyl substituents on the PBTz. First, we prepared monomers 1a-d with various branched amines (2-octyldodecyl, 2-ethylhexyl or 9-heptadecyl) and a linear alkyl amine (n-hexadecyl). Monomers 1a-d were than treated with one equivalent of $^i$PrMgCl·LiCl at 0° C., and the reaction mixture was left stirring for 1 h at room temperature and then refluxed for 24 h to afford the homopolymers P1-P4. Moderate to satisfactory isolated yields were obtained (see FIG. 1).

Subsequently, we explored the synthetic utility of the reaction among different bithiazole monomers, in particular the non-fused version. We synthesized several dibromo-alkylated bithiazoles with 2-octyldodecyl, 2-ethylhexyl, 9-heptadecyl and n-hexadecyl side chains. Reaction of the dibromo-alkylated bithiazoles with the turbo-Grignard reagent under the conditions shown in FIG. 1 succeeded in producing the corresponding homopolymers, leading us to attempt homopolymerization of the pyrrole unit fused with two thiophene units in place of the thiazole units. However, homopolymerization with the thiophene units replacing the thiazole units did not occur, as the electron-rich monomers showed uniquely low reactivity with the turbo-Grignard reagent, both at 0° C., and upon raising the temperature. Subsequent density functional theory (DFT) calculations lead us to believe that homopolymerization did not occur with the bisthiophene monomers due to kinetic barriers to the reaction.

Figure 2:
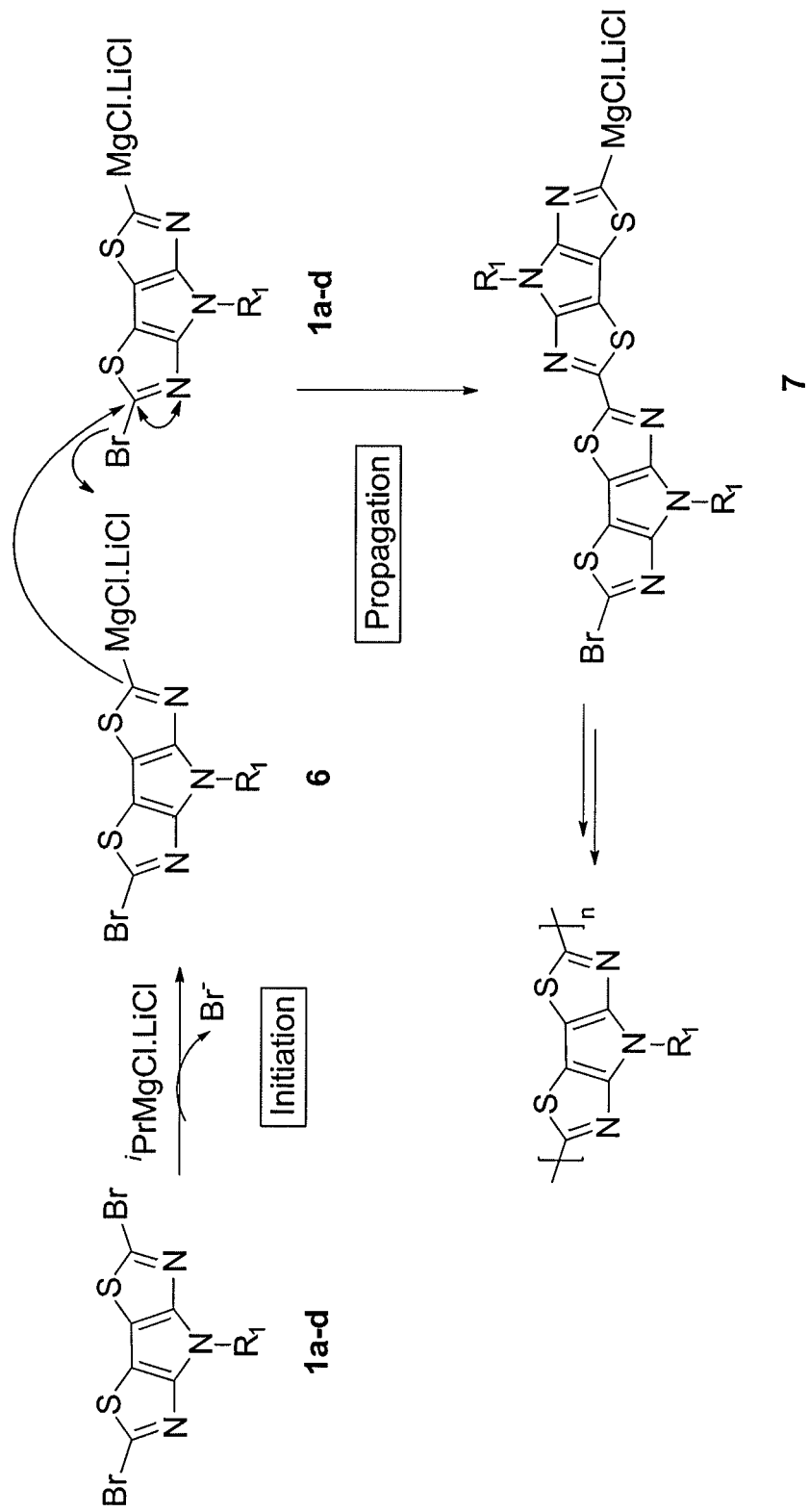
FIG. 2 is a proposed reaction mechanism for the polymerization of a pyrrolo bisthiazole homopolymer according to the reaction scheme of FIG. 1.

In any event, we propose the reaction mechanism shown in FIG. 2, based on our experimental and DFT calculations, to explain the success of the reaction scheme shown in FIG. 1. The first step (initiation) of the reaction involves the transmetallation at the thiazole unit with the $^i$PrMgCl·LiCl complex. The turbo-Grignard reagent attacks the bromide of 1a-d, resulting in the rapid Br/Mg exchange and the elimination of Br at 0° C. to form the magnesated PBTz intermediate 6. Subsequently, the Grignard species 6 reacts with another di-substituted bromo-PBTZ monomer 1a-d, affording the corresponding coupled di-PBTZ magnesium reagent 7. We propose sequential $S_NAr$ reactions between the nucleophilic Grignard portion of the molecule and the electrophilic bromine of the thiazoles. It is unlikely that the metal-halogen exchange selectively forms compound 6. Instead, it is more likely that a distribution of both mono-, di- and un-reacted moieties is formed. However, due to the nature of the reaction mechanism, as long as the overall average stoichiometry of nucleophilic Grignard and electrophilic bromide is 1:1 then a polymerization can occur. We attribute the large polydispersity of the resulting polymers to be due to the non-selective nature of the Grignard formation, which results in a large number of different propagating oligomeric fragments.

To examine the effect of using Ni(dppp)Cl$_2$ as the catalyst for the homopolymerization, we reacted monomer 6 with Ni(dppp)Cl$_2$. Immediately, a deep purple color formed, and this was followed by the formation of a precipitate within 15 min. A poorly soluble polymeric material was subsequently isolated.

The blue polymeric materials P1-P4 were purified by Soxhlet extraction using methanol, acetone, and hexane to remove monomer residues and low molecular weight oligomers, followed by precipitation of the polymer-chloroform solution into methanol. The resulting polymers were all soluble in common organic solvents, such as chloroform and chlorobenzene, at room temperature. All of the polymers exhibited good molecular weights as determined by gel permeation chromatography (GPC) using trichlorobenzene at 150° C. The resulting weight-average molecular weight ($M_w$) and number-average molecular weight ($M_n$) information are summarized in Table 1, below.

The absorption properties of all of the PBTz homopolymers were probed via UV-Vis spectroscopy in dilute chlorobenzene solution, and as thin films (see Table 1). All of the homopolymers exhibited broad absorption (450-850 nm), both in solution and thin films. For example, P1 displayed an absorbance maxima ($\lambda_{max}$) of 614 nm and 611 nm in dilute solution and solid state, respectively. In addition, all of the homopolymers exhibit a small blue shift (3-26 nm) in thin films. The similarity of absorption spectra for all the homopolymers, both in solution and in films, suggests that the polymers adopted similar geometry in solution and in the film. By extrapolation of the absorption onsets ($\lambda_{onset}$), the optical bandgap ($E^{opt}_g$) of polymers P1, P2, and P3 are estimated to be 1.46 eV, 1.42 eV, and 1.39 eV, respectively.

TABLE 1

Optical and electrochemical properties of homopolymers P1-P4

| Polymer | $M_n$ (kDa)[a] | $M_w$ (kDa)[a] | PDI[a] | $\lambda_{max}$ (nm)[b] | $\lambda_{onset}$ (nm)[b] | HOMO (eV)[c] | LUMO (eV)[d] | $E^{opt}_g$ (eV)[e] |
|---|---|---|---|---|---|---|---|---|
| P1 | 11.6 | 31.2 | 2.68 | 611 | 850 | −5.24 | −3.78 | 1.46 |
| P2 | 5.5 | 11.5 | 2.10 | 604 | 875 | −5.33 | −3.91 | 1.42 |
| P3 | 3.9 | 6.9 | 1.74 | 612 | 891 | | | 1.39 |
| P4 | 2.6 | 7.3 | 2.77 | 613 | 865 | | | 1.41 |

[a]Determined by GPC (against polystyrene standards) in trichlorobenzene at 150° C.
[b]$\lambda_{max}$ spin-coated from chlorobenzene solution on a glass surface.
[c]HOMO = (LUMO − $E^{opt}_g$) eV, LUMO is lowest unoccupied molecular orbital.
[d]LUMO = −($E_{red}$ + 4.8) eV, in which $E_{red}$ is the reduction potential referenced against ferrocene (Fc). The value for Fc with respect to zero vacuum level is estimated as −4.8 eV.
[e]$E^{opt}_g = 1240/\lambda_{onset}$.

The HOMO and LUMO energy level of the polymers was investigated by cyclic voltammetry (CV). As expected, all the homopolymers exhibit similar HOMO/LUMO energy levels, ca. −5.3 eV/−3.8 eV.

TABLE 2

OFETs characterization of homopolymers

| Polymer | $\mu_h$, lin [cm² v⁻¹ s⁻¹] | $\mu_h$, sat [cm² v⁻¹ s⁻¹] | $V_{th}$ hole (V) | $I_{on}/I_{off}$ for holes |
|---|---|---|---|---|
| P1 | 1.2 × 10⁻⁴ ± 3.2 × 10⁻⁵ | 2.2 × 10⁻⁴ ± 1.1 × 10⁻⁴ (2.9 × 10⁻⁴) | −85.1 ± 0.1 | 10²–10³ |
| P2 | 2.1 × 10⁻⁴ ± 1.1 × 10⁻⁵ | 4.6 × 10⁻⁴ ± 5.2 × 10⁻⁵ (5.0 × 10⁻⁴) | −83.6 ± 0.7 | 10²–10³ |
| P3 | — | — | — | — |
| P4 | — | — | — | — |

TABLE 3

OPV device performance of the homopolymers

| Polymer | $V_{OC}$ (V) | $J_{SC}$ (mA/cm²) | FF (%) | PCE (%/) |
|---|---|---|---|---|
| P1 | 0.30 | 0.90 (0.86) | 37.2 | 0.10 |
| P2 | 0.39 | 1.36 (0.99) | 43.3 | 0.23 |
| P3 | 0.43 | 0.36 (0.73) | 35.5 | 0.06 |
| P4 | — | — | — | — |

$J_{SC}$ are calculated from external quantum efficiency (EQE) data.
The average raw $J_{SC}$ from the solar analyzer are in parenthesis.

Thiazole-based small molecules and polymers typically exhibit lower hole mobilities than the corresponding thiophene analogs due to nonoptimal HOMO energetics, as well as synthetic barriers to accessing high molecular weights.

In order to examine the electronic structure of the newly synthesized polymers, DFT and TD-DFT calculations were performed using as a simulation cell the monomeric unit (PBTz) with methyl substituents. Namely, the two ground state structures, which are based on a single repeating unit in either cis or trans positions, were optimized using HSE06/def2-SVP within periodic boundary conditions (PBC). The trans polymer structure (zigzag) is 11.0 kcal/mol more stable than the structure in which monomers are in the cis conformation. Therefore, we have only analyzed electronic and optical properties of the trans configuration. The architecture of this polymer, with a high coplanarity along the PBTz arrays, might indicate efficient charge transfer in this material. It turns out that both molecular orbitals (HOMO and LUMO) are well delocalized over the PBTz units, and neither has contributions from the methyl groups. This justifies our strategy of changing the long chain alkyl into methyl groups, as it does not affect the frontier orbitals of this polymer. The calculated energy gap of 1.46 eV shows excellent agreement with experimentally determined values. The vertical transition energy (Evert) and oscillator strength (f) were determined by use of TD-DFT (CAM-B3LYP/6-31G**) calculations on the octamer system (8 trans PBTz units) in order to reproduce the absorption spectra of the series of experimentally obtained polymers. The calculated spectrum of the octamer structure reveals that there is one dominant lower energy transition (617.8 nm, 2.01 eV) with a large oscillator strength (f=7.41) accompanied by two higher energy transitions (546.1 nm (2.27 eV); 481.0 nm (2.58 eV)) with small oscillator strengths, f=0.0001 and 0.71, respectively. There is a good agreement between experimentally determined maximum absorption values and calculated vertical transitions.

Figure 3:
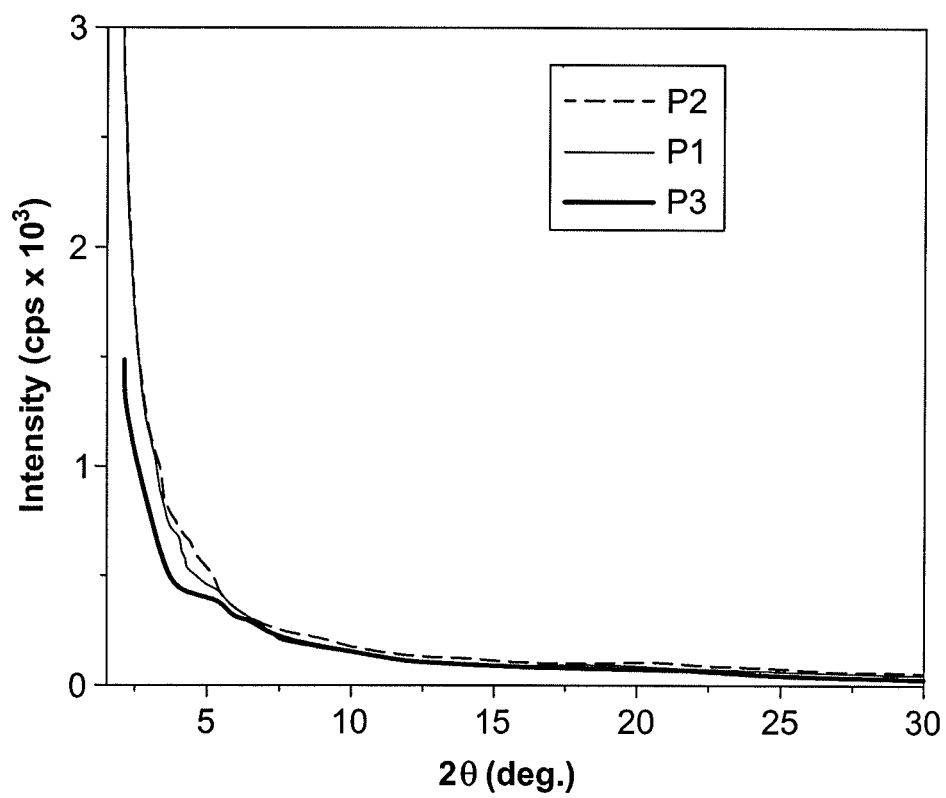
FIG. 3. are consolidated X-ray diffractograms for the homopolymers P1, P2, and P3.

Out-of-plane X-ray diffraction (XRD) was employed to understand the solid-state thin film surface morphology. The results are shown in FIG. 3. The films were prepared by solution casting. A slight bump can be observed around 2θ=5 for all three polymers (P1, P2, and P3), indicating that some lamellar interaction exists. However, the lack of intensity in the peak shows that while some crystalline intermolecular interactions are present, they are severely limited in number and size.

Atomic force microscopy (AFM) was employed to probe the roughness of the thin films. All the cast polymers exhibited relatively flat and smooth surface, with a root-mean-square (RMS) roughness of 1.47 nm, 1.36 nm and 0.60 nm for the P1, P2, and P3 polymers respectively.

Thin-film organic photovoltaic devices (OPVs) using a standard device architecture ITO/PEDOT:PSS/polymer:PC$_{71}$BM/LiF/Al were fabricated and tested under AM1.5G solar illumination (100 mW/cm²). The results of those devices are shown in Table 3, above. Surprisingly, all the device performances were quite low. The low $V_{OC}$ is likely a result of the low bandgap of the polymer, giving it a small cross gap with PC$_{71}$BM. The low $J_{SC}$ and FF however, are more likely indications of poor charge transport within the films due to poor intermolecular ordering, as observed in XRD and UV-Vis.

In summary, we report the first synthesis of conjugated homo-polymers using turbo-Grignard reagent without any transition metal catalysts. Three different homopolymers with various alkyl side-chains were synthesized. The homopolymers showed broad absorption in the solar spectrum and have low band gaps (ca. 1.4 eV). The presented results demonstrate the feasibility of transition metal free conjugated polymer synthesis.

It is to be understood that the method of making a pyrrolo bisthiazole homopolymer is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A method of making a pyrrolo bisthiazole homopolymer, comprising the step of polymerizing a fused pyrrolo [3,2-d:4,5-d']bisthiazole monomer using a turbo-Grignard reagent (iPrMgCl.LiCl) complex to obtain a conjugated homopolymer.

2. A method of making a pyrrolo bisthiazole homopolymer, comprising the steps of:
dissolving a dibrominated pyrrolo[3,2-d:4,5-d]bisthiazole monomer having the formula:

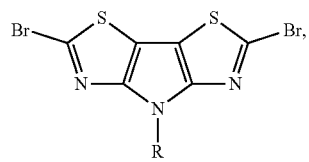

where R is an alkyl group, in anhydrous tetrahydrofuran (THF), thereby forming a solvated monomer;

treating the solvated monomer with 1 equivalent of a Turbo-Grignard reagent complex having the formula iPrMgCl.LiCl at 0° C. to form a reaction mixture;
stirring the reaction mixture for 1 hour at room temperature;
after stirring, refluxing the reaction mixture for 24 hours;
after refluxing, recovering a conjugated homopolymer product having the formula:

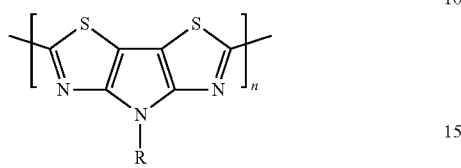

from the reaction mixture, where n is the number of repeating units of pyrrolo[3,2-d:4,5-d']bisthiazole.

3. The method of making a pyrrolo bisthiazole homopolymer according to claim 2, wherein R is selected from the group consisting of 2-octyldodecyl, n-hexadecyl, 9-heptadecyl, and 2-ethylhexyl.

\* \* \* \* \*